US008896808B2

(12) United States Patent
Tinnemans

(10) Patent No.: US 8,896,808 B2
(45) Date of Patent: Nov. 25, 2014

(54) LITHOGRAPHIC APPARATUS AND METHOD

(75) Inventor: Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 1421 days.

(21) Appl. No.: 11/471,727

(22) Filed: Jun. 21, 2006

(65) Prior Publication Data

US 2007/0296942 A1    Dec. 27, 2007

(51) Int. Cl.
*G03F 7/20* (2006.01)
*G03F 9/00* (2006.01)

(52) U.S. Cl.
CPC .......... *G03F 7/70433* (2013.01); *G03F 9/7026* (2013.01); *G03F 7/70291* (2013.01); *G03F 7/705* (2013.01)
USPC ............................................. 355/53; 355/67

(58) Field of Classification Search
CPC . G03F 7/70291; G03F 7/70433; G03F 7/705; G03F 9/7026; G03F 7/70058; G03F 7/70258; G03F 7/70308
USPC ...................................... 355/53, 67; 359/851
See application file for complete search history.

(56) References Cited

U.S. PATENT DOCUMENTS

| | | | |
|---|---|---|---|
| 5,202,748 A | 4/1993 | MacDonald et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,801,832 A | 9/1998 | Van Den Brink | |
| 5,808,797 A | 9/1998 | Bloom et al. | |
| 5,840,033 A | 11/1998 | Takeuchi | |
| 5,982,553 A | 11/1999 | Bloom et al. | |

(Continued)

FOREIGN PATENT DOCUMENTS

| | | |
|---|---|---|
| EP | 0 480 616 A1 | 4/1992 |
| JP | 61-196532 A | 8/1986 |

(Continued)

OTHER PUBLICATIONS

Ozaktas, H. et al., "The Fractional Fourier Transform: with Applications in Optics and Signal Processing," John Wiley & Sons, LTD, 2001.

(Continued)

*Primary Examiner* — Steven H Whitesell Gordon
(74) *Attorney, Agent, or Firm* — Sterne, Kessler, Goldstein & Fox P.L.L.C

(57) ABSTRACT

A lithographic apparatus includes an illumination system, an array of individually controllable elements, a projection system, and a control system. The illumination system conditions a radiation beam. The array of individually controllable elements modulates the cross-section of the radiation beam. The projection system projects the modulated radiation beam onto a target portion of a substrate. The control system calculates a pattern that is to be formed on the array of individually controllable elements. The calculation includes an adjustment of the pattern, such that its focal plane is shifted in response to a measured separation between the target portion of the substrate and a focal plane of the projection system.

19 Claims, 3 Drawing Sheets

(56) References Cited

U.S. PATENT DOCUMENTS

| | | |
|---|---|---|
| 6,118,515 A | 9/2000 | Wakamoto et al. |
| 6,133,986 A | 10/2000 | Johnson |
| 6,177,980 B1 | 1/2001 | Johnson |
| 6,304,316 B1 | 10/2001 | Jain et al. |
| 6,486,939 B2 * | 11/2002 | Lin .................................. 355/53 |
| 6,687,041 B1 | 2/2004 | Sandstrom |
| 6,741,331 B2 | 5/2004 | Boonman et al. |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,576,834 B2 | 8/2009 | George et al. |
| 2002/0167651 A1 * | 11/2002 | Boonman et al. ................ 355/67 |
| 2002/0171816 A1 * | 11/2002 | Markle ............................ 355/67 |
| 2003/0210383 A1 * | 11/2003 | Bjorklund et al. .............. 355/53 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0031221 A1 * | 2/2005 | Ludwig ......................... 382/255 |
| 2005/0225884 A1 * | 10/2005 | Gim et al. ..................... 359/851 |

FOREIGN PATENT DOCUMENTS

| | | |
|---|---|---|
| JP | 5-94935 A | 4/1993 |
| JP | 09-313487 A | 12/1997 |
| JP | 10-155792 A | 6/1998 |
| JP | 2004-363590 A | 12/2004 |
| WO | WO 98/33096 | 7/1998 |
| WO | WO 98/38597 | 9/1998 |

OTHER PUBLICATIONS

English Abstract Abstract for Japanese Publication No. JP 61-196532 A published Aug. 30, 1986, 1 pg.

Office Action for Japanese Patent Application No. 2007-161319, mailed Jul. 27, 2010, 3 pages.

English-Language Abstract for Japanese Patent Publication No. 10-155792 A, published Jun. 16, 1998; 1 page.

* cited by examiner

LITHOGRAPHIC APPARATUS AND METHOD

BACKGROUND OF THE INVENTION

1. Field of the Invention

The present invention relates to a lithographic apparatus and device manufacturing method.

2. Background Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

The lithographic apparatus includes a projection system that is used to project an image of the patterning array onto the substrate. A problem that can arise is unevenness of the substrate. Part of the image can be focused in a plane that is above or below the upper surface of the substrate. It is generally not possible to entirely resolve this problem by adjusting the position of the substrate. This is because moving the substrate such that the image is correctly focused on one part of the substrate is likely to cause the image to be out of focus on a different part of the substrate.

Therefore, what is needed is an effective system to overcome the aforementioned unevenness problems.

BRIEF SUMMARY OF THE INVENTION

According to a first embodiment of the present invention, there is provided a lithographic apparatus comprising an illumination system, an array of individually controllable elements, a projection system, and a control system. The illumination system conditions a radiation beam. The array of individually controllable elements modulates the cross-section of the radiation beam. The projection system projects the modulated radiation beam onto a target portion of a substrate. The control system calculates a pattern that is to be formed on the array of individually controllable elements. The calculation includes an adjustment of the pattern, such that its focal plane is shifted in response to a measured separation between the target portion of the substrate and a focal plane of the projection system.

According to a second embodiment of the present invention, there is provided a method comprising the following steps. Conditioning a radiation beam using an illumination system. Modulating the cross-section of the radiation beam using an array of individually controllable elements. Projecting the modulated radiation beam via a projection system onto a target portion of a substrate supported by a substrate table. A pattern is formed on the array of individually controllable elements to modulate the cross-section of the radiation beam. An adjustment is made to the pattern, such that its focal plane is shifted in response to a measured separation between the target portion of the substrate and a focal plane of the projection system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
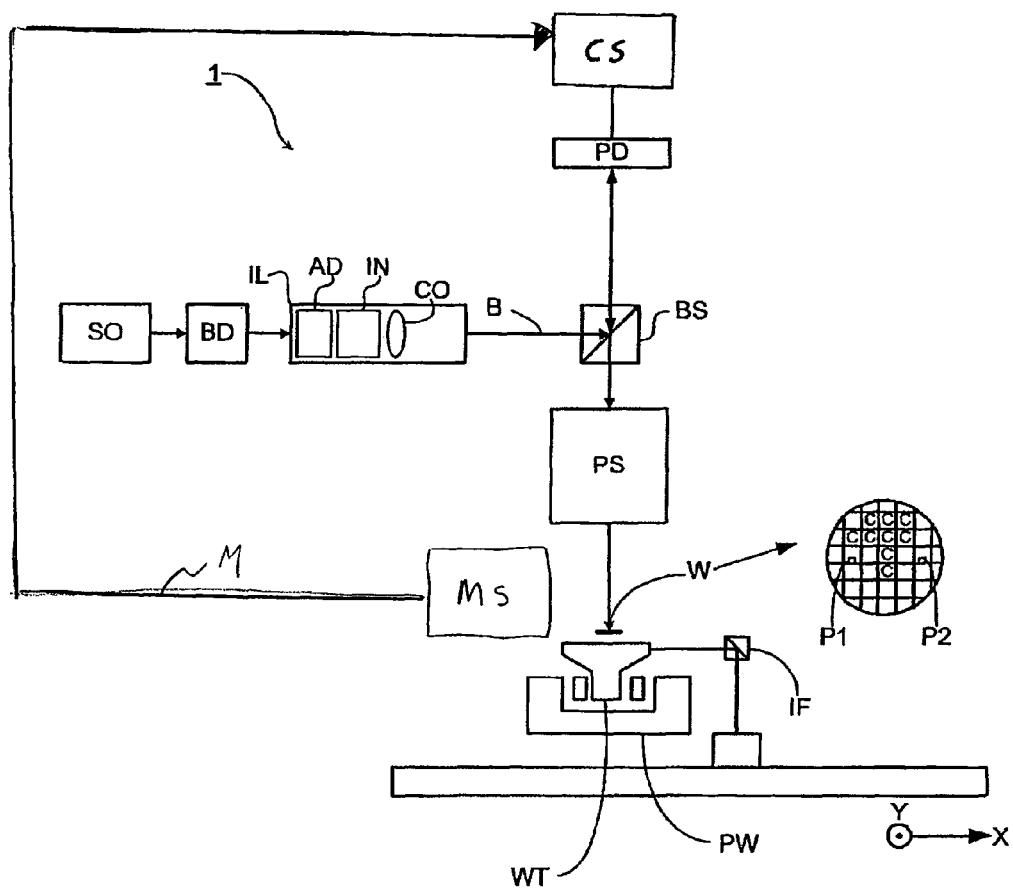
FIG. 1 depicts schematically a lithographic apparatus.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system PS can include dynamic elements, such as a synchronous scanning mirror SSM as described below. The synchronous scanning mirror SSM can require a frequency signal F from the radiation source SO and scan velocity signal SV from the substrate table WT to function, i.e., to control a resonant frequency of the synchronous scanning mirror SSM.

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another Example PD is a Programmable LCD Array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

As herein depicted in FIG. 1, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

In order to form the pattern on the substrate, it is necessary to set each of the individually controllable elements in the patterning device to the requisite state at each stage during the exposure process. Therefore, control signals, representing the requisite states, are transmitted to each of the individually controllable elements. The lithographic apparatus includes a control system CS that generates the control signals. The pattern to be formed on the substrate can be provided to the lithographic apparatus in a vector-defined format such as GDSII. In order to convert the design information into the control signals for each individually controllable element, the control system CS includes one or more data manipulation devices, each configured to perform a processing step on a data stream that represents the pattern. The data manipulation devices can collectively be referred to as the "datapath".

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

In one example, a measuring system MS can be positioned to measure characteristics of the projection system PS and/or the substrate W. This measuring system MS can comprise one or more sensors that allow for measuring such characteristics, such as optical, acoustical, mechanical or the like sensors. A measured signal M, representing the characteristics of the projection system PS and/or the substrate W, is transmitted to the control system CS. The control system CS can use the measured signal M, for example, to alter pattern data in order to compensate for the measured characteristics, as described in more detail below.

Figure 2:
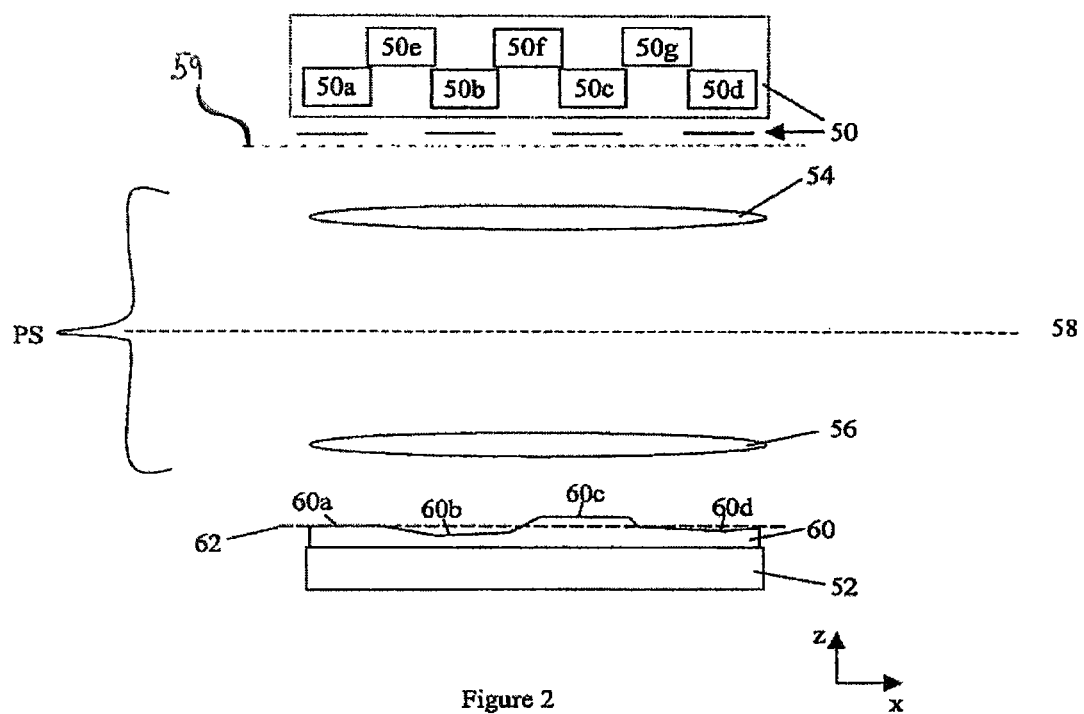
FIG. 2 depicts schematically part of the lithographic apparatus of FIG. 1.

FIG. 2 shows schematically a set of micro-mirror arrays 50, a projection system PS, and a substrate table 52 of a lithographic apparatus. The set of micro-mirror arrays 50 is shown viewed from the side and also viewed from above (surrounded by a dotted line). This illustrates that the micro-mirror arrays 50*a*-*g* are arranged in two rows in a so-called 'chess-board' configuration. For ease of description, only the first row 50*a*-*d* of micro-mirror arrays will be discussed below. For this reason only these micro-mirror arrays 50*a*-*d* are shown in cross-section in FIG. 2.

The micro-mirror arrays 50 are an example of the individually controllable elements referred to above, and it will be understood that other individually controllable elements can be used in place of the micro-mirror arrays.

The projection system PS in the example shown in FIG. 2 comprises a first lens 54, a second lens 56, and a pupil plane 58 located between the first and second lenses. The projection system PS has an object plane 59 that lies just beneath the micro-mirror arrays 50. A substrate 60 is provided on the substrate table 52. The substrate 60 can have an uneven upper surface, the unevenness being exaggerated for the purpose of illustration. Target portions of the substrate 60, which are located beneath particular micro-mirror arrays, are given corresponding reference numerals. For example, a first target portion 60*a* is located beneath the first micro-mirror array 50*a*, a second target portion 60*b* is located beneath the second micro-mirror array 50*b*, etc.

During lithographic projection (e.g., imaging), at a given moment in time it will be desired to image a pattern from the micro-mirror arrays 50*a*-*d* onto the target portions 60*a*-*d* using the projection system PS (it will be appreciated that this differs from the description further above in which only one target portion is imaged at a time). The micro-mirror arrays 50*a*-*d* are located in the object plane of the projection system PS. The image plane of the projection system is indicated by a dotted line 62. The image formed by the projection system PS is in focus at the image plane 62. It can be seen from FIG. 2 that the first target portion 60*a* lies in the image plane of the projection system PS. This means that the image of the first micro-mirror array 50*a* will be correctly focused on that target portion. However, the second and third target portions 60*b*, 60*c* fall well outside of the image plane 62, with the result that the images of the second and third micro-mirror arrays will be out of focus on the substrate. The fourth target portion 60*d* is close to the image plane, with the result that the image of the fourth micro-mirror array 50*d* can be slightly out of focus on the substrate.

The degree to which unevenness of the upper surface of the substrate 60 causes an image to be out of focus on the substrate depends upon the focal depth of the projection system PS. For a high resolution lithographic apparatus, the focal depth can be small, for example less than about 250 nm. If this is the case, out of focus images caused by substrate unevenness can be a significant problem (e.g., if the image is not sufficiently well focused, then the IC or other product which is ultimately formed may not function properly). This issue can be addressed to some extent by reducing the number and/or size of target portions imaged onto the substrate 60, thereby allowing correction via adjustment of the height of the substrate. However, this will reduce the throughput of the lithographic apparatus.

This can be addressed by adjusting the pattern provided on a given micro-mirror array, such that the image of that micro-mirror array is formed in a desired plane. For example, the pattern provided on the second micro-mirror array 50*b* is adjusted so that the plane in which the image of the pattern is in focus is moved downwards (e.g., in the −z direction), by an amount sufficient that the image of the pattern is focused on the second target portion 60*b*. Similarly, the pattern provided on the third micro-mirror array is adjusted so that plane in which the image of the pattern is in focus is moved upwards (e.g., in the z direction), by an amount sufficient that the image of the pattern is focused on the third target portion 50*c*.

References to focusing a pattern on a target portion should be understood to mean that the pattern is sufficiently in focus on the target portion and that the pattern is correctly exposed in resist provided at the target portion. The pattern will have a finite focus depth, and in general the target portion should lie within this focus depth. References to shifting the focal plane such that it corresponds with the target portion of the substrate should be understood in the same manner.

The topology of the substrate 60 can be measured prior to calculation of the patterns to be provided on the micro-mirror arrays 50*a*-*d*. For example, the measuring system MS (see FIG. 1) can measure the topology of a substrate, along with a focal plane of the projection system PS. The measurement can be performed, for example, using one or more levels. The measurement can be made at the same time as projection of a pattern onto the substrate 60. In this case, the measurement is made sufficiently early to allow the calculation to be completed before projection of the pattern onto the substrate 60. In one example, a set of pre-calculated adjusted patterns can be stored in a memory, an appropriate adjusted pattern being selected based upon the measured distance between the substrate surface and the image plane of the projection system PS (this is described further below). In this example, less time is needed between the measurement of the topology and the projection of the pattern.

The topology of the part of the substrate can be measured before beginning projection of the pattern onto the substrate 60, for example with the substrate in a separate measurement location (e.g., this is done for example in Twinscan machines made by ASML, Netherlands, which can incorporate two patterning device stages and substrate stages). In this example, the topology can be stored in a memory and retrieved from the memory when it is required.

In addition to adjusting the patterns provided on the micro-mirror arrays, the height of the substrate 60 (i.e., position in the z-direction) can be adjusted by moving the substrate table 52. For example, the height of the substrate 60 can be selected, such that the focal plane of the projection system is aligned with a plane that is a calculated average height of an upper surface of the substrate. Other calculations can be used to adjust the height of the substrate. The adjustment of the patterns provided on the micro-mirror arrays takes into account height adjustment(s) of the substrate 60.

The substrate 60 can be tilted by tilting the substrate table 52, in a manner that corresponds to the height adjustment. This can be done, for example, to correct for a slope in the upper surface of the substrate.

Although FIG. 2 shows the micro-mirror arrays 50*a*-*d* forming images that extend across the entire substrate 60, it can be the case that the images extend across only a limited region of the substrate. The embodiment of the invention functions in the same way, whether the images extend across the entire substrate 60 or only a limited region of the substrate.

In the above description, the pattern provided on a given micro-mirror array is adjusted such that the image of that array is in a plane which corresponds to the upper surface of a corresponding target portion of the substrate 60. The calculation can be, for example, based upon the measured average height of the target portion, and can adjust the image plane so that it corresponds with this average height. The calculation can be made to within a predetermined accuracy, which can, for example, be defined by a user of the lithographic apparatus or by computer, or the like.

In an alternative approach, the calculation can be simplified by restricting it such that there are only a limited number of possible image planes. For example, the number of possible image planes can be restricted to five. Each possible image plane can, for example, be separated by 100 nm, such that there is a first image plane at $Z_o$ (i.e., with no adjustment of the image plane), image planes at 100 nm and 200 nm above $Z_o$, and image planes at 100 nm and 200 nm below $Z_o$.

At a given area of the substrate 60, for example, the second target portion 60b, can have an average height measured to be about 185 nm below $Z_o$. In this case, the closest available image plane would be about 200 nm below $Z_o$. Thus, the pattern provided on the corresponding microlens array 50b would be adjusted to be focused at about 200 nm below $Z_o$. Accordingly, the adjusted patterns can be pre-calculated and stored in a memory for subsequent retrieval. This allows the required adjusted pattern to be obtained very quickly (compared to calculating the required adjusted pattern in real time).

A suitable value for the separation between adjacent image planes can be determined based upon the focal depth of the projection system. For example, a critical dimension (CD) uniformity or overlay accuracy may be compromised when the substrate is a particular distance from $Z_o$. The separation between $Z_o$ and the adjacent image plane could be selected to be less than this particular distance. In such an example, if CD uniformity begins to be compromised at about 125 nm from $Z_o$, then the adjacent image plane could be about 100 nm from $Z_o$, (i.e., above and below $Z_o$), with a further image plane about 200 nm from $Z_o$ (i.e., above and below $Z_o$).

It will be appreciated that the separation between focal planes can be a value other than 100 nm. Similarly, it will be appreciated that the number of focal planes does not have to be five, but could be any number. For example, the number of alternative focal planes (i.e., not including $Z_o$) could be two, four, or any other number.

An adjustment of the pattern on a micro-mirror array 50a-d can be performed to account for a target portion 60a-d not being in the image plane 62 of the projection system PS. This adjustment can be performed by applying a fractional Fourier transform when determining the pattern. The fractional Fourier transform can be used to take into account the displacement of the desired image plane from the actual image plane 62 of the projection system PS. Fractional Fourier transforms are described in "The Fractional Fourier Transform" by H. M Ozakta et al, published by John Wiley & Sons, 2001.

An example fractional Fourier transform can be defined as follows:

$$f_a(u) \equiv \int_{-\infty}^{\infty} K_a(u, u') f(u'),$$

$$K_a(u, u') \equiv A_a \exp[i\pi(\cot\alpha u^2 - 2\csc\alpha uu' + \cot\alpha u'^2)],$$

$$A_a \equiv \sqrt{1 - i\cot\alpha}, \quad \alpha \equiv \frac{a\pi}{2}$$

wherein 'a' represents the order of the Fourier transform. If a=1, the fractional Fourier transform equals the normal Fourier transform. In equation (1) and some subsequent equations the term "α" is used, where α=aπ/2. More details relating to this fractional Fourier transform, and variants of definition of the fractional Fourier transform, may be found in the book by H. M. Ozakta (referenced above).

By noting that $K_a(u,u')$ is a function only of (u-u'), the following function can be defined, which gives a convenient approximation of the fractional Fourier transform for small orders (i.e. small amounts of displacement of the target portion 60a-d from the image plane 62 of the projection system PS):

$$K_a(u) \equiv \frac{e^{-i\pi sgn(\alpha)/2}}{\sqrt{|\alpha|}} \exp(i\pi u^2/\alpha) \quad (2)$$

$$K_a(u) * f(u) = f_a(u)$$

The Fourier transform of $K_a(u)$, which is $\exp(-i\pi\alpha\mu^2)$, approaches unity as α approaches zero, which in turn implies that $K_a(u)$ approaches a delta function. Thus, the definition of the transform is continuous with respect to α around α=0.

Figure 3:
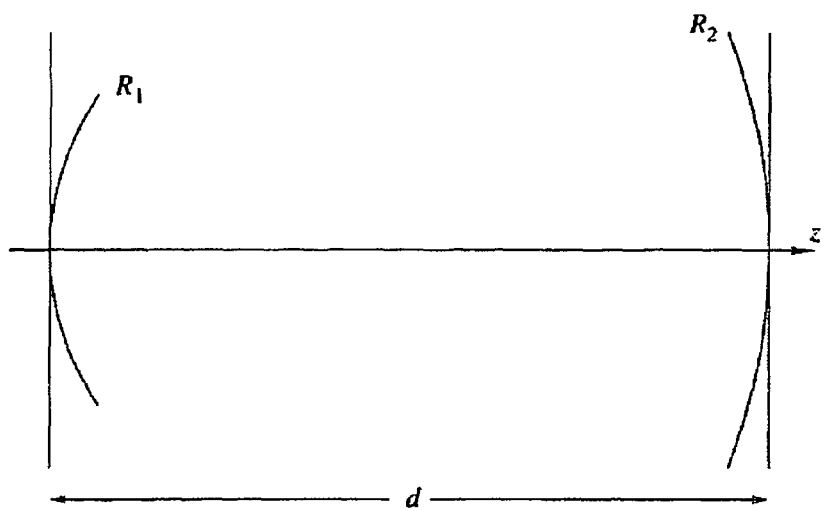
FIG. 3 depicts schematically reference surfaces.

FIG. 3 shows planar and spherical reference surfaces, the radii of the first and second spherical surfaces being denoted as $R_1$ and $R_2$ respectively. In this case, $R_1<0$ and $R_2>0$. The distance d is always taken to be positive. Referring to FIG. 3, the complex amplitude distribution with respect to first and second spherical surfaces is denoted by $\hat{f}_{sr1}(x')$ and $\hat{f}_{sr2}(x)$ respectively. The distribution with respect to the planar surfaces tangent to the spherical surfaces on the optical axis will be denoted by $\hat{f}_1(x')$ and $\hat{f}_2(x')$.

A relationship between $\hat{f}_{sr1}(x')$ and $\hat{f}_{sr2}(x)$ can be obtained. To do this the dimensionless variables $u'\equiv x'/s_1$ and $u'\equiv x'/s_2$ are introduced, where $s_1$ and $s_2$ are real-valued scale parameters with dimensions of length. The dimensionless functions $f_{sr1}(u')\equiv s_1^{1/2}\hat{f}_{sr1}(u's_1)$ and $f_{sr2}(u')\equiv s_2^{1/2}\hat{f}_{sr2}(u's_2)$ are also introduced. The relationship between $\hat{f}_{sr1}(x')$ and $\hat{f}_{sr2}(x)$ is as follows:

$$f_{sr2}(u) = \left[\frac{e^{i2\pi\sigma d}s_1^{1/2}s_2^{1/2}}{\sqrt{i\lambda d}}\right]\int \exp \quad (3)$$

$$\left[\frac{i\pi}{\lambda d}(g_2 s_2^2 u^2 - 2s_2 s_1 uu' + g_1 s_1^2 u'^2)\right] f_{sr1}(u')du'$$

which includes the following definitions:

$$g_1=1+d/R_1, \quad g_2=1-d/R_2 \quad (4)$$

If the fractional Fourier transform is to function correctly, $R_1$, $R_2$ and d must be specified such that:

$$0 \leq g_1 g_2 \leq 1 \quad (5)$$

The value of α (or equivalently a=2α/π) can be determined according to:

$$\tan\alpha = \pm\left(\frac{1}{g_1 g_2} - 1\right)^{1/2} \quad (6)$$

where the ± is determined according to the common sign of $g_1$ and $g_2$.

The above equations are applied in practice as follows: the radius of the exit pupil of the projection system PS is $R_1=-d$. The radius of the substrate is $R_2=\infty$. The image plane 62 of the projection system PS is defined such that d=0 for a substrate target portion 60a-d located in the image plane 62 of the projection system PS. According to equation (4) $g_1=0$ and $g_2=1$. The condition set out in equation (5) is satisfied. The order of the Fourier transform, according to equation (6) is α=π/2 or equivalently a=1. This indicates that the relationship between the exit pupil of the projection system PS and the target portion 60*a-d* is a normal Fourier transform (as expected).

The case of a small deviation of the target portion 60*a-d* from the image plane 62 of the projection system is now considered. The deviation is +100 nm (i.e., the target portion 60*a-d* is 100 nm above the image plane 62). The radius of the exit pupil PS is assumed to be 1 mm. This means that d=0.9999 mm. Consequently, according to equation (4) $g_1$=0.0001 and $g_2$=1. The condition set out in equation (5) is satisfied. The order of the Fourier transform, according to equation (6) is α=1.5608 or equivalently a=0.9936.

Thus, a fractional Fourier transform of order a=0.006366 (i.e., 1-0.9936) exists between the image plane of the projection system PS and the target portion 60*a-d*. The fractional Fourier transform of order a=0.006366 is applied, using equation (1) or equation (2) (which is an approximation of equation (1)), to the pattern to be provided at the micro-mirror array. This can be done by applying the fractional Fourier transform to the pattern, which is used as an input for calculating the positions of mirrors of the micro-mirror array. This adjusts the pattern in such a way that an image of the desired pattern is formed at the substrate target portion 60*a-d*.

The pattern on the micro-mirror array 50*a-d* can be adjusted in the same manner to take account of the substrate target portion 60*a-d* lying below the projection system image plane 62. Although the condition in equation (5) may not be satisfied, the adjustment to the pattern can be determined as though the substrate target portion 60*a-d* had an equivalent displacement above the projection system image plane 62.

The above description refers to adjustment of the pattern on a micro-mirror array 50*a-d* to take account of a target portion 60*a-d* not being in the focal plane 58 of the projection system PS. The use of this terminology is not intended to imply that the pattern must be first determined as if the target portion were in the focal plane of the projection system PS, and then subsequently adjusted to take account of displacement of the target portion. For example, it is possible that the adjustment is performed during calculation of the pattern itself.

Although the above example has been described in terms of the use of fractional Fourier transforms, alternative embodiments of the invention can use other techniques to adjust the pattern on the micro-mirror array. For example an approximation of the fractional Fourier transform could be used. The approximation could be for example a 2-D convolution with a chirp function for small defocus values (or a related different transformation that provides the same effect). An example of this is given in equation (4.14) of "The Fractional Fourier Transform."

The micro-mirror arrays 50 referred to above are an example of individually controllable elements that can be used to implement the invention. It will be understood that the invention can be implemented with other individually controllable elements, for example an array of diffractive optical MEMS devices.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
an array of individually controllable elements configured to modulate a radiation beam;
a projection system configured to project the modulated radiation beam onto a target portion of a substrate;
a measuring system configured to measure a separation between an image plane of the projection system and the target portion of the substrate;
a memory coupled to the control system, the memory being configured to store pre-calculated adjusted patterns; and
a control system configured to determine a projected pattern to be formed by the array of individually controllable elements, the determination including selection of a pattern from the pre-calculated adjusted patterns stored in the memory, the selection based on the measured separation between the image plane of the projection system and the target portion of the substrate such that the image plane of the projected pattern is shifted by an amount so as to focus the projected pattern onto the target portion of the substrate in response to the measured separation between the target portion of the substrate and the image plane.

2. The lithographic apparatus of claim 1, wherein the control system is configured to determine the adjustment of the image plane of the projected pattern, at least in part, using a fractional Fourier transform.

3. The lithographic apparatus of claim 1, wherein the control system is configured to adjust the array to thereby shift the image plane of the projected pattern, such that the focal plane corresponds with the target portion of the substrate.

4. The lithographic apparatus of claim 1, wherein the control system is configured to adjust the array to thereby shift the image plane of the projected pattern to one of a plurality of predetermined alternative image planes.

5. The lithographic apparatus of claim 4, wherein the control system is configured to adjust the array to achieve at least two alternative image planes.

6. The lithographic apparatus of claim 5, wherein the control system is configured to adjust the array to achieve at least four alternative image planes.

7. The lithographic apparatus of claim 1, further comprising:
a plurality of the arrays of individually controllable elements.

8. The method of claim 1, wherein the adjusted pattern includes phase-shifted features.

9. A method of forming a device, comprising:
measuring a separation between a target portion of a substrate and an image plane of a projection system to generate a measured signal;
determining an adjustment to pattern data based on the measured signal, the determining including selection of a pattern from pre-calculated adjusted patterns based on the measured separation between the image plane of the projection system and the target portion of the substrate such that the image plane of the projected pattern is shifted in response to the measured separation between the target portion of the substrate and the image plane;
forming a pattern on a patterning device using the adjusted pattern data;
patterning a beam of radiation using the patterning device; and
projecting the patterned beam onto the target portion of the substrate.

10. The method of claim 9, wherein the determining is performed at least in part using a fractional Fourier transform.

11. The method of claim 9, wherein the determining comprises shifting the image plane, such that it corresponds with the target portion of the substrate.

12. The method of claim 9, wherein the determining comprises shifting the image plane to one of a plurality of predetermined alternative image planes.

13. The method of claim 12, wherein the determining comprises providing at least two alternative image planes.

14. The method of claim 13, wherein the determining comprises providing at least four alternative image planes.

15. The method of claim 12, wherein the determining further comprises storing a plurality of predetermined adjusted patterns.

16. The method of claim 9, further comprising adjusting a height of a substrate table holding the substrate such that the image plane of the projected pattern is aligned with a plane that is a calculated average height of an upper surface of the substrate.

17. The method of claim 9, further comprising tilting a substrate table holding the substrate to correct for a slope of an upper surface of the substrate.

18. A lithographic apparatus, comprising:
an array of individually controllable elements configured to pattern a radiation beam;
a projection system configured to project the patterned beam onto a target portion of a substrate;
a measuring system configured to measure a separation between an image plane of the projection system and the target portion of the substrate; and
a control system configured to determine a projected pattern to be formed by the array of individually controllable elements, the determining including selection of a pattern from a plurality of pre-calculated adjusted patterns, the selection based on the measured separation between the image plane of the projection system and the target portion of the substrate, wherein the selected pattern causes the image plane of the projected pattern to shift by an amount so as to focus the projected pattern onto the target portion of the substrate in response to the measured separation between the target portion of the substrate and the image plane.

19. The lithographic apparatus of claim 18, wherein the control system is configured to determine the adjustment of the image plane of the projected pattern, at least in part, using a fractional Fourier transform.

* * * * *